(12) United States Patent
Hu et al.

(10) Patent No.: US 9,780,084 B2
(45) Date of Patent: Oct. 3, 2017

(54) ELECTROSTATIC DISCHARGE PROTECTION STRUCTURE AND FABRICATION METHOD THEREOF

(71) Applicant: CSMC Technologies Fab1 Co., Ltd., Wuxi, Jiangsu (CN)

(72) Inventors: Yonghai Hu, Wuxi (CN); Meng Dai, Wuxi (CN); Zhongyu Lin, Wuxi (CN); Guangyang Wang, Wuxi (CN)

(73) Assignee: CSMC TECHNOLOGIES FAB1 CO., LTD., Wuxi, Jiangsu (CN)

( * ) Notice: Subject to any disclaimer, the term of this patent is extended or adjusted under 35 U.S.C. 154(b) by 40 days.

(21) Appl. No.: 15/055,613

(22) Filed: Feb. 28, 2016

(65) Prior Publication Data

US 2016/0181237 A1    Jun. 23, 2016

Related U.S. Application Data

(62) Division of application No. 14/130,481, filed as application No. PCT/CN2013/074896 on Apr. 27, 2013, now Pat. No. 9,343,454.

(30) Foreign Application Priority Data

Apr. 28, 2012  (CN) .......................... 2012 1 0130387

(51) Int. Cl.
*H01L 21/04* (2006.01)
*H01L 27/02* (2006.01)
(Continued)

(52) U.S. Cl.
CPC ...... *H01L 27/0255* (2013.01); *H01L 21/0223* (2013.01); *H01L 21/26513* (2013.01); *H01L 21/32055* (2013.01); *H01L 21/76202* (2013.01); *H01L 21/76224* (2013.01); *H01L 21/8232* (2013.01); *H01L 27/0248* (2013.01);
(Continued)

(58) Field of Classification Search
CPC ... H01L 21/0415; H01L 21/046; H01L 21/22; H01L 23/60; H01L 27/0248
See application file for complete search history.

(56) References Cited

U.S. PATENT DOCUMENTS 6,144,070 A  * 11/2000 Devore ................... H01L 23/60
                                                              257/343
2011/0101425 A1 * 5/2011 Grote .................... H01L 29/063
                                                              257/288

* cited by examiner

*Primary Examiner* — Jae Lee
(74) *Attorney, Agent, or Firm* — Han IP Corporation; Andy M. Han

(57) ABSTRACT

An electrostatic discharge protection structure includes: substrate of a first type of conductivity, well region of a second type of conductivity, substrate contact region in the substrate and of the first type of conductivity, well contact region in the well region and of the second type of conductivity, substrate counter-doped region between the substrate contact region and the well contact region and of the second type of conductivity, well counter-doped region between the substrate contact region and the well contact region and of the first type of conductivity, communication region at a lateral junction between the substrate and the well region, first isolation region between the substrate counter-doped region and the communication region, second isolation region between the well counter-doped region and the communication region, oxide layer having one end on the first isolation region and another end on the substrate, and field plate structure on the oxide layer.

4 Claims, 5 Drawing Sheets

(51) Int. Cl.
*H01L 29/66* (2006.01)
*H01L 29/87* (2006.01)
*H01L 21/762* (2006.01)
*H01L 21/8232* (2006.01)
*H01L 21/02* (2006.01)
*H01L 21/265* (2006.01)
*H01L 21/3205* (2006.01)
*H01L 29/40* (2006.01)

(52) U.S. Cl.
CPC ...... H01L 29/402 (2013.01); H01L 29/66121 (2013.01); H01L 29/87 (2013.01); *H01L 21/02255* (2013.01)

ELECTROSTATIC DISCHARGE PROTECTION STRUCTURE AND FABRICATION METHOD THEREOF

CROSS-REFERENCE TO RELATED APPLICATION(S)

This application is a division of U.S. patent application Ser. No. 14/130,481, filed on 31 Dec. 2013, which is a U.S. national stage application of PCT Patent Application No. PCT/CN2013/074896, filed on 27 Apr. 2013 and claiming the priority benefit of China Patent Application No. 201210130387.3, filed on 28 Apr. 2012. The aforementioned applications are incorporated by reference in their entirety.

TECHNICAL FIELD

The present disclosure is related to the field of semiconductor fabrication and, more particularly, to an electrostatic discharge protection structure and a fabrication method thereof.

BACKGROUND

Electrostatic discharge (ESD) causes damages to semiconductor components.

A conventional electrostatic discharge protection structure utilizes a silicon controlled rectifier (SCR), as shown in FIG. 1. The structure of the SCR includes a PN junction structured made of a p-type substrate and an n-type well region formed by n-dopants in the p-type substrate. The p-type substrate and the n-type well region are doped with dopants to form n+ and p+ regions therein, respectively, as contact regions. Heavily doped counter-doped p+ and n+ regions are formed between the contact regions and at a lateral junction between the substrate and the well region. The n+ contact region and the p+ counter-doped region in the n-type well region are electrically coupled by a metallic lead line to form an anode. Similarly, the p+ contact region and the n+ counter-doped region in the p-type substrate are electrically coupled by a metallic lead line to form a cathode. The n+ counter-doped region is equivalent to the emitter of an NPN transistor, and the p+ counter-doped region is equivalent to the emitter of a PNP transistor. The NPN transistor and the PNP transistor are coupled together to form the SCR.

During normal operation (the voltage at the anode being higher than that at the cathode), a diode formed between the n-type well region and the p-type substrate is reverse-biased and the operating voltage is below the breakdown voltage of the diode, thus the SCR is not triggered and the current is small. However, during a surge of electrostatic discharge, the voltage at the anode reaches the breakdown voltage. This results in impact ionization to generate a large amount of electron-hole pairs that move toward the n-type well region and the p-type substrate under the effect of electric field. The movement of the holes into the p-type substrate causes a potential drop, resulting in the connection between the base and emitter of the PN junction to allow electrons to flow from the emitter to the base. The same mechanism also causes carrier drift in the n-type well region to cause holes to flow from the emitter to the base. The drift of electrons and holes cause the electric potential to increase or decrease, thus further enhancing the degree of impact ionization. This bootstrap process allows the SCR to form a current channel suitable for electrostatic discharge with low resistance and for large amount of current.

However, this type of conventional electrostatic discharge protection structure has the problem of high trigger voltage (or threshold voltage), this may result in ESD damage for components with thinner oxide layer and higher susceptibility to damage due to the higher trigger voltage.

SUMMARY

Therefore, there is a need to address the problem of high trigger voltage in conventional electrostatic discharge protection structures by providing an electrostatic discharge protection structure with a trigger voltage that is adjustable by simple adjustment during design and fabrication thereof.

An electrostatic discharge protection structure may comprise: a substrate being of a first type of electrical conductivity; a well region in the substrate and being of a second type of electrical conductivity; a substrate contact region in the substrate and being of the first type of electrical conductivity; a well contact region in the well region and being of the second type of electrical conductivity; a substrate counter-doped region in the substrate, between the substrate contact region and the well contact region, and being of the second type of electrical conductivity; a well counter-doped region in the well region, between the substrate contact region and the well contact region, and being of the first type of electrical conductivity; a communication region at a lateral junction between the substrate and the well region and between the substrate counter-doped region and the well counter-doped region, the communication region in contact with the substrate and the well region; a first isolation region in the substrate and between the substrate counter-doped region and the communication region; a second isolation region in the well region and between the well counter-doped region and the communication region; an oxide layer adjacent to but not in contact with the communication region, the oxide layer configured such that either a first end of the oxide layer is disposed on the first isolation region and a second end of the oxide layer is disposed on the substrate or the first end of the oxide layer is disposed on the second isolation region and the second end of the oxide layer is disposed on the well region; and a field plate structure disposed on the oxide layer.

In one embodiment, the first type of electrical conductivity is p type and the second type of electrical conductivity is n type; the communication region is of the n type of electrical conductivity; the first end of the oxide layer is disposed on the first isolation region and the second end of the oxide layer is disposed on the substrate; the electrostatic discharge protection structure further comprises an anode lead line or a cathode lead line; the anode lead line is electrically coupled to the well counter-doped region and the well contact region; and the cathode lead line is electrically coupled to the substrate contact region, the substrate counter-doped region, and the field plate structure.

In one embodiment, the first type of electrical conductivity is p type and the second type of electrical conductivity is n type; the communication region is of the p type of electrical conductivity; the first end of the oxide layer is disposed on the second isolation region and the second end of the oxide layer is disposed on the well region; the electrostatic discharge protection structure further comprises an anode lead line or a cathode lead line; the anode lead line is electrically coupled to the well counter-doped region, the well contact region, and the field plate structure; and the cathode lead line is electrically coupled to the substrate contact region and the substrate counter-doped region.

In one embodiment, the first type of electrical conductivity is n type and the second type of electrical conductivity is p type; the communication region is of the p type of electrical conductivity; the first end of the oxide layer is disposed on the first isolation region and the second end of the oxide layer is disposed on the substrate; the electrostatic discharge protection structure further comprises an anode lead line or a cathode lead line; the anode lead line is electrically coupled to the substrate contact region, the substrate counter-doped region, and the field plate structure; and the cathode lead line is electrically coupled to the well counter-doped region and the well contact region.

In one embodiment, the first type of electrical conductivity is n type and the second type of electrical conductivity is p type; the communication region is of the n type of electrical conductivity; the first end of the oxide layer is disposed on the second isolation region and the second end of the oxide layer is disposed on the well region; the electrostatic discharge protection structure further comprises an anode lead line or a cathode lead line; the anode lead line is electrically coupled to the substrate contact region and the substrate counter-doped region; and the cathode lead line is electrically coupled to the well counter-doped region, the well contact region, and the field plate structure.

In one embodiment, a material of the field plate structure comprises polysilicon.

In one embodiment, the first isolation region and the second isolation region comprise shallow trench isolation structures.

A method of fabrication of an electrostatic discharge protection structure may comprise: providing a substrate of a first type of electrical conductivity; forming a first isolation region and a second isolation region in the substrate; forming a well region of a second type of electrical conductivity in the substrate by ion implantation, the first isolation region located in the substrate, the second isolation region located in the well region; forming an oxide layer by thermal oxidation such that either a first end of the oxide layer is disposed on the first isolation region and a second end of the oxide layer is disposed on the substrate or the first end of the oxide layer is disposed on the second isolation region and the second end of the oxide layer is disposed on the well region; forming a field plate structure on the oxide layer by deposition; forming, by ion implantation, a substrate contact region of the first type of electrical conductivity in the substrate, a well contact region of the second type of electrical conductivity in the well region, a substrate counter-doped region of the second type of electrical conductivity in the substrate and between the substrate contact region and the well contact region, a well counter-doped region of the first type of electrical conductivity in the well region and between the substrate contact region and the well contact region, and a communication region; the communication region is disposed at a lateral junction between the substrate and the well region and between the substrate counter-doped region and the well counter-doped region; and the communication region is in contact with the substrate and the well region.

In one embodiment, the method may further comprise forming anode and cathode lead lines after forming the contact regions and communication region by ion implantation.

In one embodiment, a material of the field plate structure comprises polysilicon.

In one embodiment, the first isolation region and the second isolation region comprise shallow trench isolation structures.

In the above-described electrostatic discharged protection structure, when electrostatic discharge occurs, the anode potential rises and a depletion region is formed in the substrate and the well region, with the width of the depletion region at the surface of the substrate limited by a width of the field plate structure (i.e., the position of the edge of the field plate structure). As the anode potential continues to rise, strength of the electric field continues to rise until reaching the avalanche breakdown voltage of a unidirectional diode formed by the communication region that connects the substrate and the well region. At this time a large amount of electron-hole pairs are generated to trigger the SCR to form an electrostatic discharge channel to achieve the function of electrostatic discharge protection. The trigger voltage of the SCR, which is the avalanche breakdown voltage of the unidirectional diode, may be adjusted by adjustment of the width and position of the field plate structure during design and fabrication. Also, with the communication region, the trigger voltage is lower than that in conventional designs.

DETAILED DESCRIPTION OF THE PREFERRED EMBODIMENTS

In order to promote better understanding of the purpose, features and advantages of the present disclosure, detailed description of select embodiments of the present disclosure is provided below with reference to the attached figures.

First Embodiment

Figure 1:
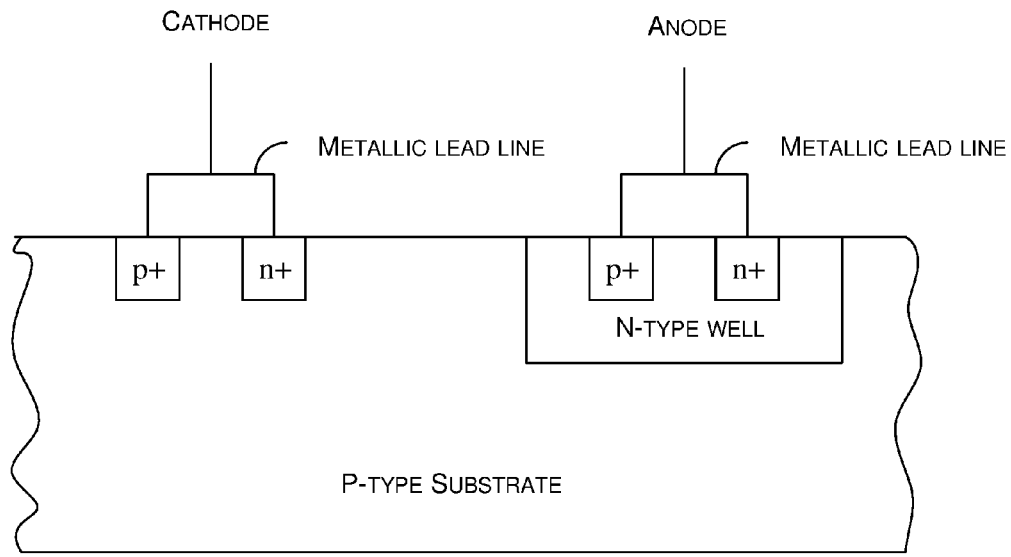
FIG. 1 is a diagram of a cross-sectional view of a conventional electrostatic discharge protection structure that utilizes SCR.
Figure 2:
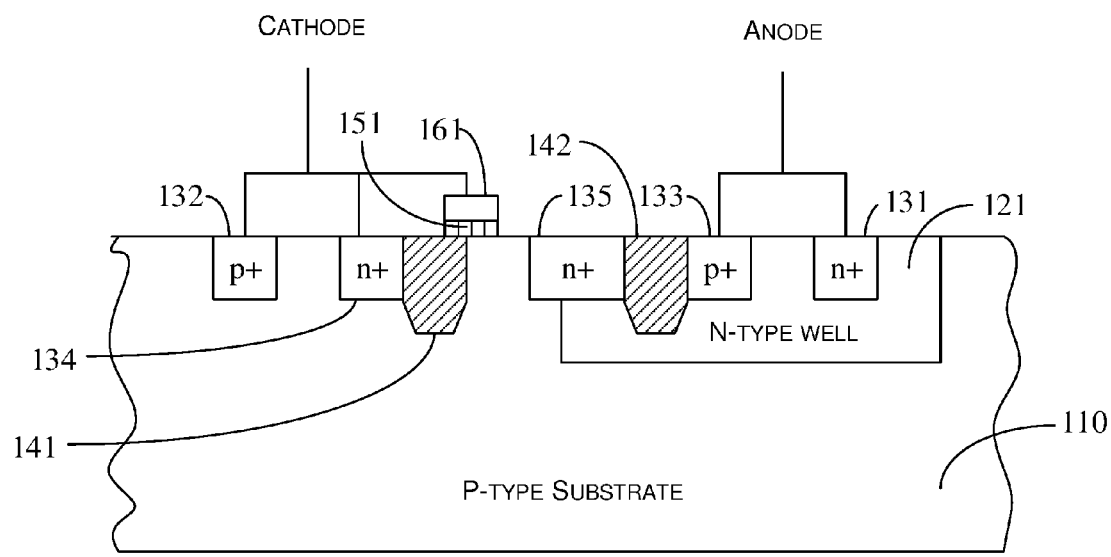
FIG. 2 is a diagram of a cross-sectional view of an electrostatic discharge protection structure of a first embodiment of the present disclosure.

FIG. 2 is a diagram of a cross-sectional view of an electrostatic discharge protection structure of a first embodiment of the present disclosure, which includes a p-type substrate 110 and an n-type well 121 formed therein by light doping. The n-type well 121 includes an n+ well contact region 131 and a p+ well counter-doped region 133 that are formed by heavy doping. Correspondingly, the p-type substrate 110 includes a p+ substrate contact region 132 and an n+ substrate counter-doped region 134 that are formed by heaving doping. The substrate counter-doped region 134 and well counter-doped region 133 are both located between the substrate contact region 132 and the well contact region 131.

Between the substrate counter-doped region 134 and the well counter-doped region 133, which is also the lateral junction between surface of the p-type substrate 110 and surface of the n-type well 121, an n+ communication region 135 is formed by heavy doping. The communication region 135 connects the p-type substrate 110 and the n-type well 121, extending the n-type well 121 into the p-type substrate 110 from the surface of the p-type substrate 110 and the surface of the n-type well 121 to form a unidirectional diode. With the communication region 135 the trigger voltage of the lateral SCR formed by the well counter-doped region 133, the n-type well 212, the p-type substrate 110, and the substrate counter-doped region 134.

A first isolation region 141 is formed between the communication region 135 and the substrate counter-doped region 134, and a second isolation region 142 is formed between the communication region 135 and the well counter-doped region 133. In one embodiment, a shallow trench isolation (STI) structure is adopted for the first isolation region 141 and the second isolation region 142. Other isolation structures may be utilized in other embodiments, such as a local field oxidation of silicon (LOCOS) structure for example. The first isolation region 141 and the second isolation region 142 define the aforementioned unidirectional diode.

An oxide layer 151 of a silicon dioxide material is disposed over the p-type substrate 110 and between the communication region 135 and the substrate counter-doped region 134. One end of the oxide layer 151 is disposed on the first isolation region 141 and the other end of the oxide layer 151 is disposed on the p-type substrate 110. It is noteworthy that the oxide layer 151 is not to be in direct contact with the communication region 135. A field plate structure 161 is disposed on the oxide layer 151. In one embodiment the field plate structure 161 is made of polysilicon which may be doped depending on the need in implementation. In other embodiments a metal field plate, such as an aluminum field plate, may be used.

A cathode lead line is disposed on the p-type substrate 110 to electrically couple the substrate contact region 132, the substrate counter-doped region 134 and the field plate structure 161. An anode lead line is disposed on the n-type well 121 to electrically couple the well counter-doped region 133 and the well contact region 131. Note that in FIG. 2 the anode and cathode lead lines are shown as lines and not the rectangles encircled by the lead lines.

In the above-described electrostatic discharged protection structure, when electrostatic discharge occurs, the anode potential rises and a depletion region is formed in the p-type substrate 110 and the n-type well 121. As the field plate structure 161 is electrically coupled to the cathode as an electric field plate, the width of the depletion region at the surface of the p-type substrate 110 is limited by a width of the field plate structure 161 (i.e., the position of the edge of the field plate structure 161). As the anode potential continues to rise, strength of the electric field continues to rise until reaching the avalanche breakdown voltage of the unidirectional diode. At this time a large amount of electron-hole pairs are generated and enter the n-type well 121 and the p-type substrate 110 to trigger the SCR. The NPN transistor formed by the substrate counter-doped region 134, the p-type substrate 110 and the n-type well 121 as well as the PNP transistor formed by the well counter-doped region 133, the n-type well 212 and the p-type substrate 110 become conductive to form a path for electrostatic discharge to achieve the function of electrostatic discharge protection. The trigger voltage of the SCR, which is the avalanche breakdown voltage of the unidirectional diode, may be adjusted by adjustment of the width and position of the field plate structure 161 during design and fabrication. The electric conductivity of the SCR is relatively less effected by the unidirectional diode.

Second Embodiment

Figure 3:
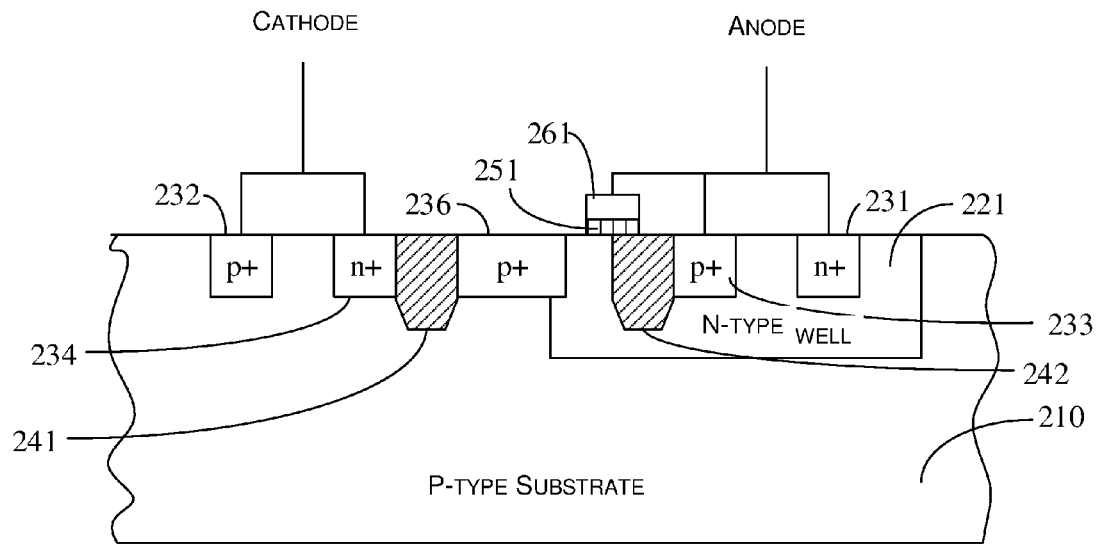
FIG. 3 is a diagram of a cross-sectional view of an electrostatic discharge protection structure of a second embodiment of the present disclosure.

FIG. 3 is a diagram of a cross-sectional view of an electrostatic discharge protection structure of a second embodiment of the present disclosure. In particular, the electrostatic discharge protection structure includes a p-type substrate 210 and an n-type well 221 formed by lightly doping the p-type substrate 210. The n-type well 221 includes an n+ well contact region 231 and a p+ well counter-doped region 233 by heaving doping. Correspondingly, the p-type substrate 210 includes a p+ substrate contact region 232 and an n+ substrate counter-doped region 234 by heaving doping. The substrate counter-doped region 234 and the well counter-doped region 233 are located between the substrate contact region 232 and the well contact region 231.

Between the substrate counter-doped region 234 and the well counter-doped region 233, which is also a lateral junction between surface of the p-type substrate 210 and surface of the n-type well 221, a p+ communication region 236 is formed by heavy doping. The communication region 236 connects the p-type substrate 210 and the n-type well 221, extending the p-type substrate 210 into the n-type well 221 to form a unidirectional diode.

A first isolation region 241 is formed between the communication region 236 and the substrate counter-doped region 234, and a second isolation region 242 is formed between the communication region 236 and the well counter-doped region 233. In one embodiment, a shallow trench isolation (STI) structure is adopted for the first isolation region 241 and the second isolation region 242. Other isolation structures may be utilized in other embodiments, such as a local field oxidation of silicon (LOCOS) structure for example.

An oxide layer 251 of a silicon dioxide material is disposed over the n-type well 221 and between the communication region 236 and the well counter-doped region 233. One end of the oxide layer 251 is disposed on the second isolation region 242 and the other end of the oxide layer 251 is disposed on the n-type well 221. It is noteworthy that the oxide layer 251 is not to be in direct contact with the communication region 236. A field plate structure 261 is disposed on the oxide layer 251. In one embodiment the field plate structure 261 is made of polysilicon. In other embodiments a metal field plate, such as an aluminum field plate, may be used.

A cathode lead line is disposed on the p-type substrate 210 to electrically couple the substrate contact region 232 and the substrate counter-doped region 234. An anode lead line is disposed on the n-type well 221 to electrically couple the well counter-doped region 233, the well contact region 231 and the field plate structure 261. Note that in FIG. 3 the anode and cathode lead lines are shown as lines and not the rectangles encircled by the lead lines.

Third Embodiment

Figure 4:
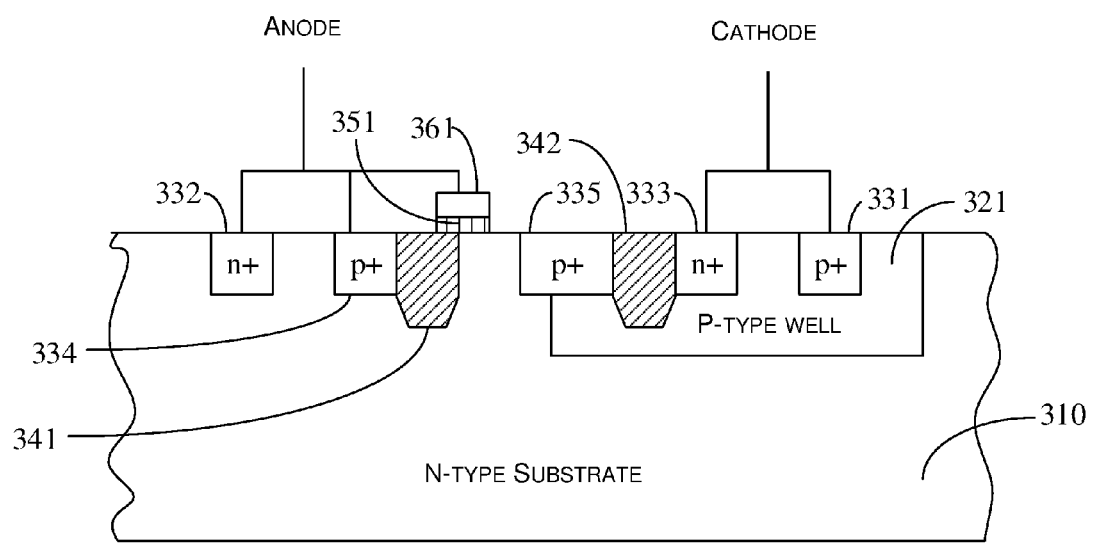
FIG. 4 is a diagram of a cross-sectional view of an electrostatic discharge protection structure of a third embodiment of the present disclosure.

FIG. 4 is a diagram of a cross-sectional view of an electrostatic discharge protection structure of a third embodiment of the present disclosure. In the illustrated embodiment the p-type substrate and n-type well of the first embodiment are changed to an n-type substrate and a p-type well. The structure includes an n-type substrate 310 and a p-type well 321 formed by light doping. The p-type well 321 includes a p+ well contact region 331 and an n+ well counter-doped region 333 by heavy doping. Correspondingly, the n-type substrate 310 includes an n+ substrate contact region 332 and a p+ substrate counter-doped region 334 by heavy doping. The substrate counter-doped region 334 and the well counter-doped region 333 are located between the substrate contact region 332 and the well contact region 331.

Between the substrate counter-doped region 334 and the well counter-doped region 333, which is also a lateral junction between surface of the n-type substrate 310 and surface of the p-type well 321, a p+ communication region 335 is formed by heavy doping. The communication region 335 connects the n-type substrate 310 and the p-type well 321, extending the p-type well 321 into the n-type substrate 310 to form a unidirectional diode.

A first isolation region 341 is formed between the communication region 335 and the substrate counter-doped region 334, and a second isolation region 342 is formed between the communication region 335 and the well counter-doped region 333. In one embodiment, a shallow trench isolation (STI) structure is adopted for the first isolation region 341 and the second isolation region 342. Other isolation structures may be utilized in other embodiments, such as a local field oxidation of silicon (LOCOS) structure for example.

An oxide layer 351 of a silicon dioxide material is disposed over the n-type substrate 310 and between the communication region 335 and the substrate counter-doped region 334. One end of the oxide layer 351 is disposed on the first isolation region 341 and the other end of the oxide layer 351 is disposed on the n-type substrate 310. It is noteworthy that the oxide layer 351 is not to be in direct contact with the communication region 335. A field plate structure 361 is disposed on the oxide layer 351. In one embodiment the field plate structure 361 is made of polysilicon. In other embodiments a metal field plate, such as an aluminum field plate, may be used.

A cathode lead line is disposed on the n-type substrate 310 to electrically couple the substrate contact region 332, the substrate counter-doped region 334 and the field plate structure 361. An anode lead line is disposed on the p-type well 321 to electrically couple the well counter-doped region 333 and the well contact region 331. Note that in FIG. 4 the anode and cathode lead lines are shown as lines and not the rectangles encircled by the lead lines.

Fourth Embodiment

Figure 5:
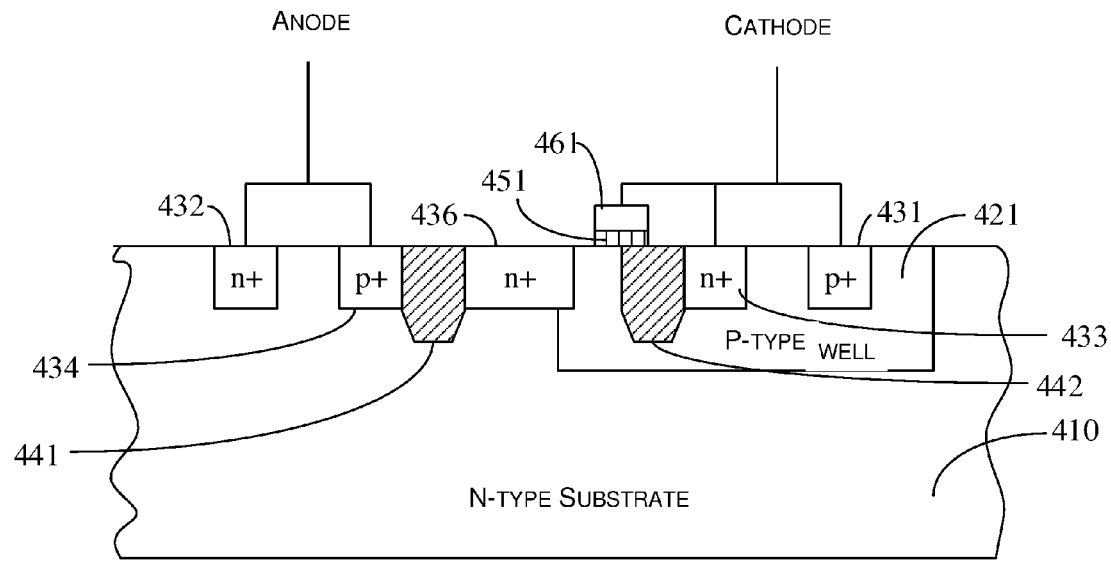
FIG. 5 is a diagram of a cross-sectional view of an electrostatic discharge protection structure of a fourth embodiment of the present disclosure.

FIG. 5 is a diagram of a cross-sectional view of an electrostatic discharge protection structure of a fourth embodiment of the present disclosure. In the illustrated embodiment the p-type substrate and n-type well of the second embodiment are changed to an n-type substrate and a p-type well. The structure includes an n-type substrate 410 and a p-type well 421 formed by light doping. The p-type well 421 includes a p+ well contact region 431 and an n+ well counter-doped region 433 by heavy doping. Correspondingly, the n-type substrate 410 includes an n+ substrate contact region 432 and a p+ substrate counter-doped region 434 by heavy doping. The substrate counter-doped region 434 and the well counter-doped region 433 are located between the substrate contact region 432 and the well contact region 431.

Between the substrate counter-doped region 434 and the well counter-doped region 433, which is also a lateral junction between surface of the n-type substrate 410 and surface of the p-type well 421, an n+ communication region 436 is formed by heavy doping. The communication region 436 connects the n-type substrate 410 and the p-type well 421, extending the n-type substrate 410 into the p-type well 421 to form a unidirectional diode.

A first isolation region 441 is formed between the communication region 436 and the substrate counter-doped region 434, and a second isolation region 442 is formed between the communication region 436 and the well counter-doped region 433. In one embodiment, a shallow trench isolation (STI) structure is adopted for the first isolation region 441 and the second isolation region 442. Other isolation structures may be utilized in other embodiments, such as a local field oxidation of silicon (LOCOS) structure for example.

An oxide layer 451 of a silicon dioxide material is disposed over the p-type well 421 and between the communication region 436 and the substrate contact region 433. One end of the oxide layer 451 is disposed on the second isolation region 442 and the other end of the oxide layer 451 is disposed on the p-type well 421. It is noteworthy that the oxide layer 451 is not to be in direct contact with the communication region 436. A field plate structure 461 is disposed on the oxide layer 451. In one embodiment the field plate structure 461 is made of polysilicon. In other embodiments a metal field plate, such as an aluminum field plate, may be used.

A cathode lead line is disposed on the n-type substrate 410 to electrically couple the substrate contact region 432 and the substrate counter-doped region 434. An anode lead line is disposed on the p-type well 421 to electrically couple the well counter-doped region 433, the well contact region 431 and the field plate structure 461. Note that in FIG. 5 the anode and cathode lead lines are shown as lines and not the rectangles encircled by the lead lines.

FIGS. 6-11 illustrate the cross-sectional views of an electrostatic discharge protection structure during the fabrication process thereof.

Figure 12:
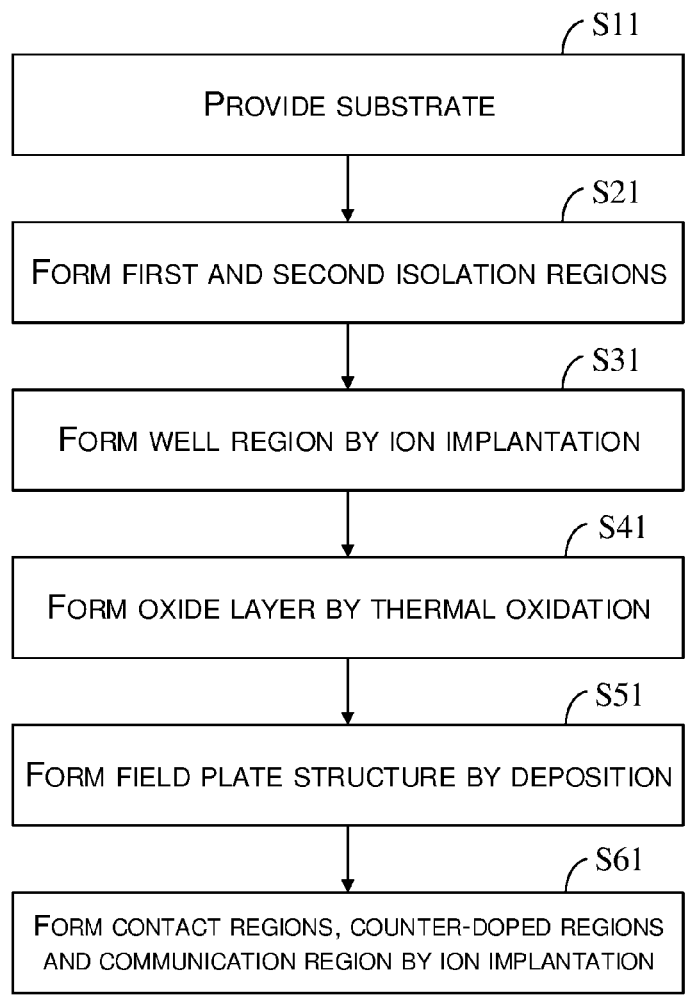
FIG. 12 is a flowchart of a method of fabrication of an electrostatic discharge protection structure of the present disclosure.

FIG. 12 is a flowchart of a method of fabrication of an electrostatic discharge protection structure, including the following steps:

S11, a substrate of a first type of electrical conductivity is provided.

Figure 6:
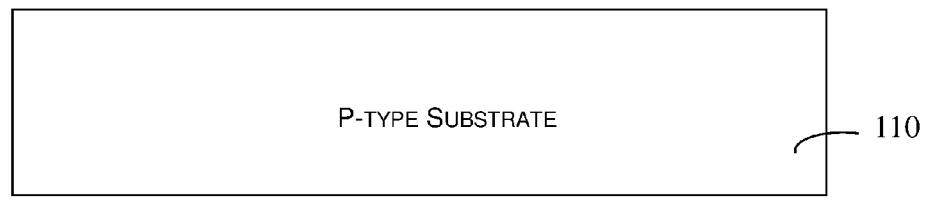
FIG. 6 is a diagram of a cross-sectional view of an electrostatic discharge protection structure after step S11 of a fabrication process of the present disclosure.

Referring to FIG. 6, c a lightly doped p-type silicon wafer is used to make the p-type substrate 110.

S21, a first isolation region and a second isolation region are formed in the substrate.

Figure 7:
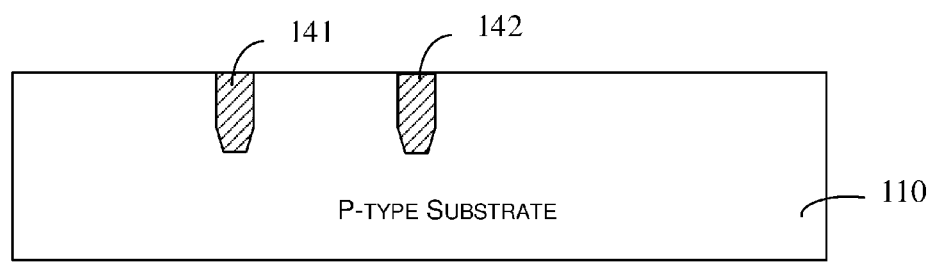
FIG. 7 is a diagram of a cross-sectional view of an electrostatic discharge protection structure after step S21 of a fabrication process of the present disclosure.

Referring to FIG. 7, a shallow trench isolation (STI) structure is adopted for the first isolation region 141 and the second isolation region 142. Other isolation structures may be utilized in other embodiments, such as a local field oxidation of silicon (LOCOS) structure for example.

S31, a well region of a second type of electrical conductivity is formed in the substrate by ion implantation.

Figure 8:
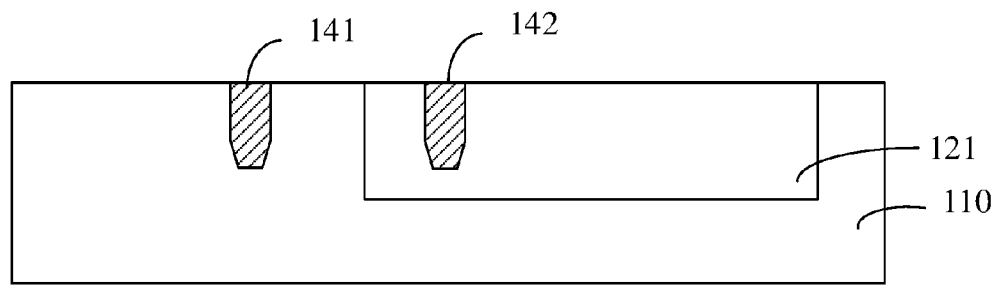
FIG. 8 is a diagram of a cross-sectional view of an electrostatic discharge protection structure after step S31 of a fabrication process of the present disclosure.

The second isolation region is disposed in the well region, and the first isolation region is disposed in the substrate outside the well region. Referring to FIG. 8, using the electrostatic discharge protection structure of the first embodiment as an example, the n-type well 121 is formed by ion implantation with light dopants.

S41, an oxide layer is formed by thermal oxidation.

Figure 9:
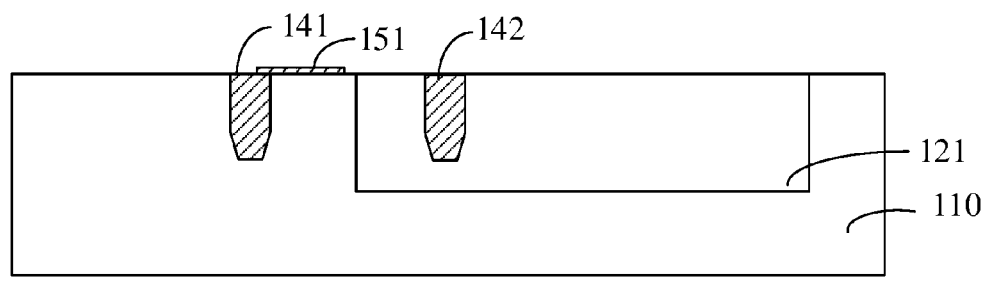
FIG. 9 is a diagram of a cross-sectional view of an electrostatic discharge protection structure after step S41 of a fabrication process of the present disclosure.

The oxide layer is formed on the surface of the silicon wafer. In one embodiment, one end of the oxide layer is disposed on the first isolation region, and the other end of the oxide layer is disposed on the substrate. In another embodiment, one end of the oxide layer is disposed on the second isolation layer, and the other end of the oxide layer is disposed on the well region. Referring to FIG. 9, using the electrostatic discharge protection structure of the first embodiment as an example, the oxide layer 151 (which is a silicon dioxide layer) is formed on the surface of p-type substrate 110 and is not in contact with the n-type well. One end of the oxide layer 151 is disposed on the first isolation layer 141 and the other end of the oxide layer 151 is disposed on the p-type substrate 110.

S51, a field plate structure is formed on the oxide layer by deposition.

Figure 10:
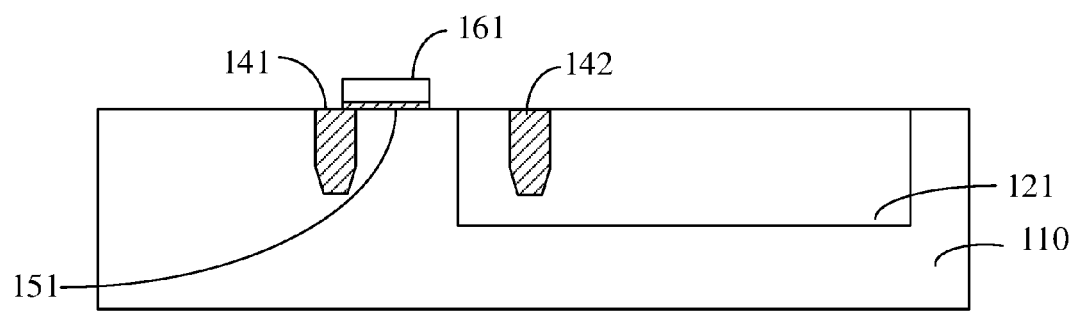
FIG. 10 is a diagram of a cross-sectional view of an electrostatic discharge protection structure after step S51 of a fabrication process of the present disclosure.

Referring to FIG. 10, the field plate structure 161 is made of a polysilicon material, which may be doped depending on the need in implementation. In other embodiments a metallic field plate, such as an aluminum field plate for example, may be used.

S61, contact regions, counter-doped regions and communication region are formed in the substrate and the well region, respectively, by ion implantation.

Contact regions include substrate contact region, substrate counter-doped region, well counter-doped region and well contact region. The substrate contact region is in the substrate and is of the first type of electrical conductivity. The substrate counter-doped region is in the substrate and is of the second type of electrical conductivity. The well counter-doped region is in the well region and is of the first type of electrical conductivity. The well contact region is in the well region and is of the second type of electrical conductivity.

The communication region is disposed at the lateral junction between the substrate and the well region, between the substrate counter-doped region and the well counter-doped region, and extends into the substrate and the well region to be in direct contact with the substrate and the well region.

Figure 11:
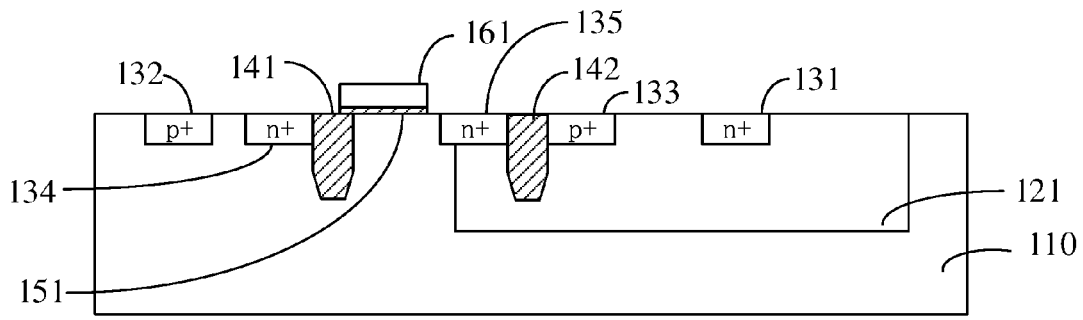
FIG. 11 is a diagram of a cross-sectional view of an electrostatic discharge protection structure after step S61 of a fabrication process of the present disclosure.

Referring to FIG. 11, using the electrostatic discharge protection structure of the first embodiment as an example, the contact regions include the substrate contact region 132 and the well contact region 131. The counter doped regions include the substrate counter-doped region 134 and the well counter-doped region 133. The second isolation region 142 is disposed between the well counter-doped region 133 and the communication region 135 to isolate the well counter-doped region 133 and the communication region 135 from one another. The first isolation region 141 is disposed between the substrate counter-doped region 134 and the communication region 135 to isolate the substrate counter-doped region 134 and the communication region 135 from one another. Given that the first isolation region 141 functions as a barrier layer during ion implantation, the first isolation layer 141 is immediately adjacent to the substrate counter-doped region 134 and the communication region 135.

Following step S61, the process includes steps for forming anode and cathode lead lines. Using the electrostatic discharge protection structure of the first embodiment as an example, the cathode lead line may be formed on the p-type substrate 110 by deposition to electrically couple the substrate contact region 132, the substrate counter-doped region 134 and the field plate structure 161. The anode lead line may be formed on the n-type well 121 to electrically couple the well counter-doped region 133 and the well contact region 131.

The above-described fabrication method of electrostatic discharge protection structures is compatible with conventional CMOS fabrication method, and thus has a relatively low cost of production.

The above-described embodiments represent select few examples of implementation. The description thereof is detailed but is not to be construed as limiting the scope of the invention of the present disclosure. Rather, those with ordinary skill in the art may derive various modifications and improvements of the present disclosure without deviating from the concept of the present disclosure. For example, the single-well design of the disclosed electrostatic discharge protection structure may be replaced with a double-well design. Such variations are within the protective scope of the present disclosure. Therefore, the protective scope of the present disclosure is to be determined based on the attached claims.

What is claimed is:

1. A method of fabrication of an electrostatic discharge protection structure, the method comprising:
providing a substrate of a first type of electrical conductivity;
forming a first isolation region and a second isolation region in the substrate;
forming a well region of a second type of electrical conductivity in the substrate by ion implantation, the first isolation region located in the substrate, the second isolation region located in the well region;
forming an oxide layer by thermal oxidation such that:
a first end of the oxide layer is disposed on the first isolation region and a second end of the oxide layer is disposed on the substrate, or
the first end of the oxide layer is disposed on the second isolation region and the second end of the oxide layer is disposed on the well region;
forming a field plate structure on a side of the oxide layer by deposition, the side of the oxide layer facing away from the substrate;
forming, by ion implantation, a substrate contact region of the first type of electrical conductivity in the substrate, a well contact region of the second type of electrical conductivity in the well region, a substrate counter-doped region of the second type of electrical conductivity in the substrate and between the substrate contact region and the well contact region, a well counter-doped region of the first type of electrical conductivity in the well region and between the substrate contact region and the well contact region, and a communication region, wherein the communication region is disposed at a lateral junction between the substrate and the well region and between the substrate counter-doped region and the well counter-doped region, and wherein the communication region is in contact with the substrate and the well region.

2. The method of fabrication of an electrostatic discharge protection structure of claim 1, further comprising:

forming anode and cathode lead lines after forming the contact regions and communication region by ion implantation.

3. The method of fabrication of an electrostatic discharge protection structure claim 1, wherein a material of the field plate structure comprises polysilicon.

4. The method of fabrication of an electrostatic discharge protection structure of claim 1, wherein the first isolation region and the second isolation region comprise shallow trench isolation structures.

* * * * *